(12) United States Patent
Haarahiltunen et al.

(10) Patent No.: US 11,810,987 B2
(45) Date of Patent: Nov. 7, 2023

(54) RADIATION SENSOR ELEMENT AND METHOD

(71) Applicant: ELFYS OY, Espoo (FI)

(72) Inventors: Antti Haarahiltunen, Perttula (FI); Juha Heinonen, Espoo (FI); Mikko Juntunen, Kirkkonummi (FI); Chiara Modanese, Espoo (FI); Toni Pasanen, Espoo (FI); Hele Savin, Espoo (FI); Ville Vähänissi, Vantaa (FI)

(73) Assignee: ELFYS OY, Espoo (FI)

( * ) Notice: Subject to any disclaimer, the term of this patent is extended or adjusted under 35 U.S.C. 154(b) by 13 days.

(21) Appl. No.: 17/614,884

(22) PCT Filed: May 26, 2020

(86) PCT No.: PCT/FI2020/050352
§ 371 (c)(1),
(2) Date: Nov. 29, 2021

(87) PCT Pub. No.: WO2020/240087
PCT Pub. Date: Dec. 3, 2020

(65) Prior Publication Data
US 2022/0216354 A1    Jul. 7, 2022

(30) Foreign Application Priority Data

May 31, 2019 (FI) .................................. 20195457

(51) Int. Cl.
*G01T 1/20* (2006.01)
*H01L 31/0236* (2006.01)
(Continued)

(52) U.S. Cl.
CPC .... *H01L 31/02363* (2013.01); *G01T 1/20183* (2020.05); *G01T 1/24* (2013.01);
(Continued)

(58) Field of Classification Search
CPC .......................... G01T 1/2018; G01T 1/20183
See application file for complete search history.

(56) References Cited

U.S. PATENT DOCUMENTS 7,888,766 B2    2/2011   Shibayama
8,212,327 B2    7/2012   Kurfiss
(Continued)

FOREIGN PATENT DOCUMENTS

EP    2237318 A2    10/2010
FI    127794 B      2/2019
(Continued)

OTHER PUBLICATIONS

Finnish Search Report for Finnish Application No. 20195457 dated Dec. 3, 2019 (2 pages).
(Continued)

*Primary Examiner* — David P Porta
*Assistant Examiner* — Shun Lee
(74) *Attorney, Agent, or Firm* — ALSTON & BIRD LLP (57) ABSTRACT

This disclosure relates to a radiation sensor element comprising a semiconductor substrate, having a bulk refractive index; a front surface; a back surface, extending substantially along a base plane; and a plurality of pixel portions. Each pixel portion comprises a collection region on the back surface and a textured region on the front surface. The textured regions comprise high aspect ratio nanostructures, extending substantially along a thickness direction perpendicular to the base plane and forming an optical conversion layer, having an effective refractive index gradually changing towards the bulk refractive index to reduce reflection of light incident on said pixel portion from the front side of the semiconductor substrate.

20 Claims, 2 Drawing Sheets

(51) Int. Cl.
*G01T 1/24* (2006.01)
*H01L 27/146* (2006.01)
*H01L 31/115* (2006.01)

(52) U.S. Cl.
CPC .... *H01L 27/1461* (2013.01); *H01L 27/14676* (2013.01); *H01L 31/115* (2013.01)

(56) References Cited

U.S. PATENT DOCUMENTS

| | | |
|---|---|---|
| 10,014,332 B2 | 7/2018 | Nishihara |
| 10,950,646 B2 | 3/2021 | Sato |
| 2004/0174951 A1 | 9/2004 | Hoffman |
| 2012/0298874 A1* | 11/2012 | Kaneko .................. G01T 1/202 250/361 R |
| 2013/0161522 A1 | 6/2013 | Ishida et al. |
| 2016/0112614 A1 | 4/2016 | Masuda et al. |
| 2017/0358694 A1 | 12/2017 | Juntunen et al. |

FOREIGN PATENT DOCUMENTS

| | | |
|---|---|---|
| JP | 2003086827 | 3/2003 |
| JP | 2004296827 | 10/2004 |
| JP | 2013033864 | 2/2013 |
| JP | 2015220313 | 12/2015 |
| WO | WO-2011/035188 A2 | 3/2011 |
| WO | WO-2011/160130 A2 | 12/2011 |
| WO | WO-2013/142815 A1 | 9/2013 |
| WO | WO-2016/017305 A1 | 2/2016 |
| WO | WO-2018/150088 A1 | 8/2018 |
| WO | WO-2018/219915 A1 | 12/2018 |

OTHER PUBLICATIONS

International Search Report for International Application No. PCT/FI2020/050352 (ISA/FI) dated Oct. 5, 2020 (6 pages).
International Preliminary Report On Patentability for International Application No. PCT/FI2020/050352 (IPEA/EP) dated Jul. 29, 2021 (19 pages).
Frey, L et al., Enhancing near-infrared photodetection efficieny in SPAD with silicon surface nanostructuration, In: IEEE Journal of the Electron Devices Society USA: Feb. 28, 2018, vol. 6, No. 1, 392-395, ISSN 2168-6734 (print).
Japanese Patent Application No. 2021-570917, Office Action dated Jan. 17, 2023 (12 pages).

* cited by examiner

RADIATION SENSOR ELEMENT AND METHOD

CROSS-REFERENCE TO RELATED APPLICATIONS

The present application is a national phase entry of International Application No. PCT/FI2020/050352, filed May 26, 2020, which claims priority to Finnish Application No. 20195457, filed May 31, 2019, which are incorporated herein by reference in their entirety.

FIELD OF TECHNOLOGY

This disclosure concerns radiation detectors. In particular, this disclosure concerns semiconductor pixel detectors.

BACKGROUND

Semiconductor pixel detectors are used widely in consumer electronics, for example, in cameras, as well as in a variety of industrial and scientific settings, for example, in photodetectors, X-ray detectors, and particle detectors.

In conventional detectors, cross talk, e.g., optical cross talk, between individual pixels may pose considerable challenges. Typically, optical cross talk has been reduced by depositing dielectric antireflection coating layers. However, dielectric antireflection coatings may possess reduced anti-reflective properties at high incidence angles. Moreover, in case of conventional semiconductor detectors comprising a scintillator for converting ionizing radiation to non-ionizing electromagnetic radiation, coupling the scintillator to a substrate may be challenging.

In light of this, it may be desirable to develop new solutions related to semiconductor pixel detectors.

SUMMARY

This summary is provided to introduce a selection of concepts in a simplified form that are further described below in the detailed description. This Summary is not intended to identify key features or essential features of the claimed subject matter, nor is it intended to be used to limit the scope of the claimed subject matter.

According to a first aspect, a radiation sensor element is provided. The radiation sensor element comprises a semiconductor substrate, having bulk majority charge carriers of a first polarity, a bulk refractive index, a front surface, defining a front side of the semiconductor substrate, and a back surface, arranged opposite the front surface and extending substantially along a base plane.

The radiation sensor element comprises a plurality of pixel portions, each pixel portion of the plurality of pixel portions comprising a collection region on the back surface for collecting free charge carriers of a second polarity opposite in sign to the first polarity.

Each pixel portion of the plurality of pixel portions comprises a textured region on the front surface, the textured region comprising high aspect ratio nanostructures, extending substantially along a thickness direction perpendicular to the base plane and forming an optical conversion layer, having an effective refractive index gradually changing towards the bulk refractive index to reduce reflection of light incident on said pixel portion from the front side of the semiconductor substrate.

According to a second aspect, a method for fabricating a radiation sensor element comprising a plurality of pixel portions is provided. The method comprises providing a semiconductor substrate, having bulk majority charge carriers of a first polarity, a bulk refractive index, a front surface, defining a front side of the semiconductor substrate, and a back surface, arranged opposite the front surface and extending substantially along a base plane; for each pixel portion of the plurality of pixel portions, forming a collection region on the back surface for collecting free charge carriers of a second polarity opposite in sign to the first polarity; for each pixel portion of the plurality of pixel portions, forming a textured region on the front surface, the textured region comprising high aspect ratio nanostructures, extending substantially along a thickness direction perpendicular to the base plane and forming an optical conversion layer, having an effective refractive index gradually changing towards the bulk refractive index to reduce reflection of light incident on said pixel portion from the front side of the semiconductor substrate.

BRIEF DESCRIPTION OF THE DRAWINGS

The present disclosure will be better understood from the following detailed description read in light of the accompanying drawings, wherein.

Unless specifically stated to the contrary, any drawing of the aforementioned drawings may be not drawn to scale such that any element in said drawing may be drawn with inaccurate proportions with respect to other elements in said drawing in order to emphasize certain structural aspects of the embodiment of said drawing.

Moreover, corresponding elements in the embodiments of any two drawings of the aforementioned drawings may be disproportionate to each other in said two drawings in order to emphasize certain structural aspects of the embodiments of said two drawings.

DETAILED DESCRIPTION

Figure 1:
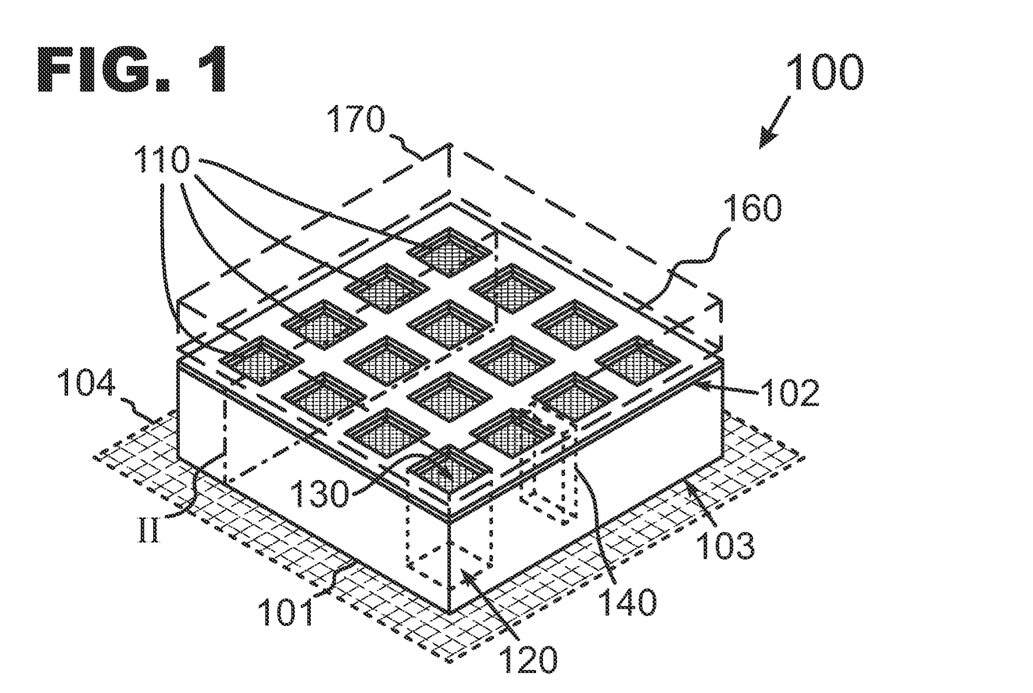
FIG. 1 shows an isometric view of a radiation sensor element.
Figure 2:
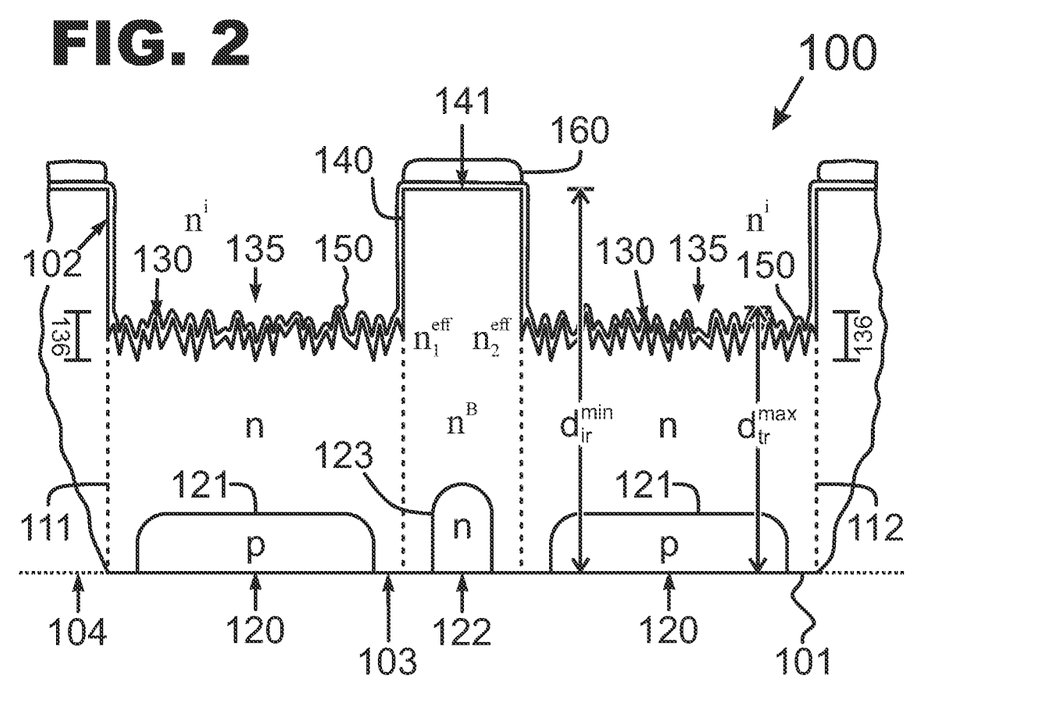
FIG. 2 depicts a partial cross-sectional view of the radiation sensor element along cross-sectional plane II of FIG. 1.

FIGS. 1 and 2 depict a radiation sensor element 100 according to an embodiment. In particular, FIG. 2 depicts a cross-sectional view of the radiation sensor element 100 along cross-sectional plane II of FIG. 1. Since FIG. 2 depicts a cross section of the radiation sensor element 100, FIG. 2 does not limit shapes of the embodiment of FIGS. 1 and 2 or any part(s) thereof in any direction forming an angle with the cross-sectional plane II of FIG. 1. In other embodiments, a radiation sensor element may be identical, similar, or different to the radiation sensor element 100 of the embodiment of FIGS. 1 and 2.

Herein, "radiation" is to be understood broadly, covering, for example, electromagnetic radiation and particle radiation. Radiation may generally correspond to ionizing radiation or non-ionizing radiation.

In this specification, "ionizing" radiation may refer to radiation with sufficient particle or photon energy to induce ionization in a medium. Ionizing radiation may comprise radiation with particle or photon energies of at least 3.89 electron volts (eV), at least 10 eV, or at least 33 eV, for example. On the other hand, "non-ionizing" radiation may herein refer to radiation with insufficient particle or photon energy to induce substantial ionization in a medium. Non-ionizing radiation may comprise radiation with particle or photon energies of less than 33 eV, less than 10 eV, or less than 3.89 eV, for example.

Throughout this specification, a "radiation detector" may refer to a complete, operable radiation detector. A radiation detector may generally comprise at least one radiation sensor. A radiation detector may comprise also other elements, units, and/or structures.

In this disclosure, a "radiation sensor" may refer to an operable unit, module, or device configured to detect and/or measure radiation and to register, indicate, and/or respond to said radiation.

Further, a "radiation sensor element" may refer to an element, which may form, as such, a radiation sensor.

Alternatively, a radiation sensor element may be used as one element of a radiation sensor comprising also other elements and/or structures. A radiation sensor element may comprise an active material, a physical property of which is utilized in said radiation sensor element in order to register, indicate, and/or respond to radiation incident on said active material. A radiation sensor element may correspond to an indirect-conversion radiation sensor element or a direct-conversion radiation sensor element.

Throughout this disclosure, an "indirect-conversion radiation sensor element" may refer to a radiation sensor element comprising a scintillator for converting ionizing radiation to non-ionizing electromagnetic radiation and active material for detecting the electromagnetic radiation emitted by the scintillator.

By contrast, a "direct-conversion radiation sensor element" may refer to a radiation sensor element not requiring the use of a scintillator to convert ionizing radiation to non-ionizing electromagnetic radiation in order to detect said ionizing radiation.

In this specification, a "scintillator" may refer to an element, comprising material that emits light when excited by ionizing radiation, such as particle radiation. Generally, luminescence of a scintillator may result in emission of light to a large solid angle.

Consequently, light from a scintillator may commonly reach a textured region at high incidence angles.

In the embodiment of FIGS. 1 and 2, the radiation sensor element 100 comprises a semiconductor substrate 101.

Herein, "semiconductor" may refer to material, such as silicon (Si) or germanium (Ge), possessing an electrical conductivity intermediate between the conductivity of conductive materials, such as metals, and the conductivity of insulating materials, such as many plastics and glasses. A semiconductor material may generally have a doping level, which may be adjusted in order to tune properties of said semiconductor material in a controllable manner.

Throughout this specification, a "substrate" may refer to a layer or other element or structure suitable for or configured to provide a surface whereon other layers or other elements or structures may be coupled, bonded, mounted, arranged, deposited, laminated, and/or fabricated. Consequently, a "semiconductor substrate" may refer to a substrate comprising and/or formed of a semiconductor material, such as a semiconductor wafer or die.

The semiconductor substrate 101 of the embodiment of FIGS. 1 and 2 has bulk majority charge carriers of a first polarity. In case of the embodiment of FIGS. 1 and 2, the first polarity is negative. In other embodiments, a semiconductor substrate may have bulk majority charge carriers of a first polarity, which may be negative or positive.

Throughout this disclosure, a "charge carrier" may refer to a freely moving particle or quasiparticle carrying electric charge in an element or a part thereof. Generally, such element or a part thereof may comprise one or more types of charge carriers. For example, a semiconductor may comprise electrons and holes as charge carriers. Consequently, a "majority charge carrier" may refer to a more common or abundant type of charge carrier in an element or a part thereof. For example, in an n-type semiconductor, electrons may act as majority charge carriers. Further, "bulk" may refer to a larger and/or greater part of an element. Additionally or alternatively, bulk may refer to an inner and/or central part of an element. As such, "bulk majority charge carriers" may refer to majority charge carriers of an element in a bulk part thereof.

The semiconductor substrate 101 of the embodiment of FIGS. 1 and 2 may be formed of Si. In other embodiments, a semiconductor substrate may comprise any suitable material(s), for example, Si and/or Ge.

The semiconductor substrate 101 of the embodiment of FIGS. 1 and 2 may have a bulk electrical resistivity of at least 100 ohm-meters ($\Omega$m) at normal temperature and pressure (NTP) conditions, corresponding to a bulk majority charge carrier concentration less than or equal to about $4 \times 10^{11}$ per cubic centimeter ($cm^{-3}$). In other embodiments, a semiconductor substrate, which may or may not be formed of Si, may have any suitable bulk majority charge carrier concentration, for example, a bulk majority charge carrier concentration less than or equal to about $1 \times 10^{20}$ $cm^{-3}$, or $1 \times 10^{16}$ $cm^{-3}$, or $1 \times 10^{12}$ $cm^{-3}$.

The semiconductor substrate 101 of the embodiment of FIGS. 1 and 2 has a bulk refractive index.

In this specification, "refractive index" of a medium may refer to a ratio between speed of light in vacuum and a phase velocity of light in said medium. Generally, the term "refractive index" may or may not refer to a complex-valued refractive index. Further, a "bulk refractive index" of an element may refer to a refractive index of a bulk part of said element.

Herein, "light" may refer to electromagnetic radiation of any wavelength within a range of relevant wavelengths. Such range of relevant wavelengths may or may not overlap or coincide with ultraviolet (wavelength from about 10 nanometers (nm) to about 400 nm), visible (wavelength from about 400 nm to about 700 nm), and/or infrared (wavelength from about 700 nm to about 1 millimeter (mm)) parts of electromagnetic spectrum.

The semiconductor substrate 101 of the embodiment of FIGS. 1 and 2 has a front surface 102. The front surface 102 of the semiconductor substrate 101 defines a front side of the semiconductor substrate 101.

Throughout this disclosure, a "surface" may refer to a finite part of a generalization of a plane, which may have a non-zero, possibly position-dependent, curvature and which may or may not be connected, path-connected, or simply connected. Additionally or alternatively, a surface may refer to a part of an outer boundary of a body or an element. A surface may specifically refer to a part of an outer boundary of a body or an element viewable from a particular viewing direction, or a part thereof.

The semiconductor substrate 101 of the embodiment of FIGS. 1 and 2 has a back surface 103. The back surface 103 of the semiconductor substrate 101 is arranged opposite the front surface 102, and it extends substantially along a fictitious base plane 104.

Herein, a "base plane" may refer to a fictitious generalization of a plane, which may or may not have a non-zero, possibly position-dependent curvature. As such, a base plane may or may not be planar.

The base plane 104 of the embodiment of FIGS. 1 and 2 is planar. In other embodiments, a semiconductor substrate may be flat or curved, having a front surface, which extends substantially along a planar or a curved base plane, respectively.

In the embodiment of FIGS. 1 and 2, a thickness direction is defined perpendicular to the base plane 104.

The thickness direction extends vertically in FIGS. 1 and 2. In some embodiments, wherein a base plane is curved, a thickness direction may be position-dependent. In other such embodiments, a single position-independent thickness direction may be defined.

In the embodiment of FIGS. 1 and 2, the radiation sensor element 100 comprises a plurality of pixel portions 110.

Throughout this disclosure, a "plurality" of elements or features may refer to a group of two or more, or three or more, etc., of said elements or features, respectively. Further, a "portion" of a radiation sensor element may refer to a part of a radiation sensor element, extending from a region on a front surface of a semiconductor substrate to a region on a back surface of a semiconductor substrate. Herein, a "region" may refer to a part of a surface. Consequently, a "pixel portion" may refer to a portion of a radiation sensor element, which may be utilized in said radiation sensor element in order to register, indicate, and/or respond to radiation incident specifically on said pixel portion. Individual pixel portions of a plurality of pixel portions may or may not abut one another, i.e., they may or may not share a common boundary with one another. Such common boundary may extend, for example, within a semiconductor substrate.

In the embodiment of FIGS. 1 and 2, individual pixel portions of the plurality of pixel portions 110 may possess identical or similar features. As such, each pixel portion of the embodiment of FIGS. 1 and 2 may belong to the plurality of pixel portions 110, and the radiation sensor element 100 may comprise only a single plurality of pixel portions 110. In other embodiments, a radiation sensor element may comprise at least one (i.e., one or more, two or more, etc.) plurality of pixel portions.

The plurality of pixel portions 110 of the embodiment of FIGS. 1 and 2 forms a regular, rectangular two-dimensional array of pixel portions. In other embodiments, a plurality of pixel portions may or may not form an array of pixel portions, e.g., a one-dimensional or a two-dimensional array of pixel portions, which may or may not be regular and which may have any suitable symmetry properties.

Individual pixel portions of the plurality of pixel portions 110 of the embodiment of FIGS. 1 and 2 may have lateral sizes of 1 millimeter (mm)×1 mm parallel to the base plane 104. In other embodiments, individual pixel portions of a plurality of pixel portions may have any suitable lateral shapes and sizes, for example, in case of substantially cuboidal pixel portions, lateral sizes in a range from 5 micrometers (µm)×5 µm to 10 mm×10 mm, or from 10 µm×10 µm to 1 mm×1 mm, or from 50 µm×50 µm to 0.5 mm×0.5 mm.

In the embodiment of FIGS. 1 and 2, each pixel portion of the plurality of pixel portions 110 comprises a collection region 120 on the back surface 103 of the semiconductor substrate 101.

Herein, a "collection region" may refer to a region, which may be arranged on a back surface of a semiconductor substrate with bulk majority charge carriers of a first polarity, suitable for or configured to collect free charge carriers of a second polarity opposite in sign to the first polarity. Such free charge carriers may be collected, for example, to an integrated or an external electrical read-out circuit.

Specifically, a collection region of a pixel portion may be suitable for or configured to collect free charge carriers from said pixel portion.

As depicted schematically in FIG. 2 for two exemplary pixel portions 111, 112, the collection regions 120 are defined by collection doping wells 121. A collection region being defined by a collection doping well may promote separation of free charge carriers, which may increase a quantum efficiency of a radiation sensor element. In other embodiments, a collection region may be defined by any suitable means, for example, by a collection doping well, or an interface between a semiconductor substrate and a conductor pattern, such as a metallization pad or a solder bump, or a through-hole in a dielectric layer on a back surface of a semiconductor substrate.

In this disclosure, a "layer" may refer to a generally sheet-shaped element arranged on a surface or a body. Additionally or alternatively, a layer may refer to one of a series of superimposed, overlaid, or stacked generally sheet-shaped elements. A layer may generally comprise a plurality of sublayers of different materials or material compositions. Some layers may be path-connected, whereas other layers may be locally path-connected and disconnected.

Throughout this disclosure, a "dielectric" material may refer to a material, which may exhibit a low electrical conductivity. Additionally or alternatively, dielectric material may be electrically polarizable. Generally, dielectric material may have any suitable relative permittivity, for example, a relative permittivity of at least 2, at least 3, at least 5, or at least 20. Consequently, a dielectric layer may refer to a layer comprising or formed of dielectric material.

Herein, existence of a "through-hole" in a layer may refer to a shape of said layer being such that said layer comprises a discontinuity. Additionally or alternatively, a through-hole may refer to a hole in a topological (homeomorphism) sense.

The collection doping wells 121 of the embodiment of FIGS. 1 and 2 are formed in the semiconductor substrate 101. Such collection doping wells may generally be formed at least partly by a dopant implantation step and/or a dopant diffusion step.

In the embodiment of FIGS. 1 and 2, the radiation sensor element 100 comprises a bulk contact region 122 on the back surface 103 of the semiconductor substrate 101, as illustrated in FIG. 2. Generally, such bulk contact region on a back surface of a semiconductor substrate may facilitate coupling a scintillator onto a semiconductor substrate and/or enable arranging a plurality of radiation sensor elements in close proximity to one another, when electrical connections for individual pixels are not necessary on one or more sides of a radiation sensor element. In other embodiments, a radiation sensor element may comprise one or more bulk contact regions, which may or may not be arranged on a back surface of semiconductor substrate.

Throughout this specification, a "bulk contact region" may refer to a region on a surface, such as a back surface, of a semiconductor substrate with bulk majority charge carriers of a first polarity, suitable for or configured to collect free charge carriers of the first polarity and/or to collect free charge carriers from a bulk part of said semiconductor substrate.

As depicted schematically in FIG. 2, the bulk contact region 122 is defined by bulk contact doping well 123. A bulk contact region being defined by bulk contact doping well may promote separation of free charge carriers, which may increase a quantum efficiency of a radiation sensor element. In other embodiments, a bulk contact region may be defined by any suitable means, for example, by a bulk contact doping well, or an interface between a semiconductor substrate and a conductor pattern, such as a metallization pad or a solder bump, or a through-hole in a dielectric layer on a semiconductor substrate.

Although not specifically depicted in either of FIGS. 1 and 2, a radiation sensor element, such as the radiation sensor element 100 of the embodiment of FIGS. 1 and 2, may generally comprise conductor pattern(s) electrically connected to a collection region and/or a bulk contact region.

As depicted schematically in FIG. 2 for the two exemplary pixel portions 111, 112, each pixel portion of the plurality of pixel portions 110 comprises a textured region 130 on the front surface 102.

Herein, a "textured region" may refer to a non-smooth, patterned, and/or nanostructured region, which may be arranged on a front surface of a semiconductor substrate.

The textured regions 130 of the embodiment of FIGS. 1 and 2 comprise high aspect ratio nanostructures 135.

In this disclosure, "high aspect ratio nanostructures" may refer to nanostructures having their height, in a thickness direction, multiple times their lateral dimensions. Such nanostructures may comprise, for example, cylindrical pillars, conical pillars, or narrow pyramids.

The high aspect ratio nanostructures 135 of the embodiment of FIGS. 1 and 2 extend substantially along the thickness direction. In other embodiments, wherein a base plane is curved, high aspect ratio nanostructures may extend substantially along a position-dependent thickness direction or a single, position-independent thickness direction.

As depicted schematically in FIG. 2 for the two exemplary pixel portions 111, 112, the high aspect ratio nanostructures 135 of the embodiment of FIGS. 1 and 2 form optical conversion layers 136. The optical conversion layers 136 have effective refractive indices $n_1^{\it{eff}}$, $n_2^{\it{eff}}$ gradually changing towards the bulk refractive index $n^B$. This reduces reflection of light incident on individual pixel portions of the plurality of pixel portions 110 from the front side of the semiconductor substrate 101. Generally, such high aspect ratio nanostructures may reduce optical cross talk between individual pixels of a radiation sensor element, especially in case a scintillator is to be arranged on a front side of at least one pixel portion of a radiation sensor element. Such reduction in optical cross talk may result from reduced reflections within a radiation sensor element, for example, between a scintillator and a semiconductor substrate.

Throughout this specification, an "optical conversion layer" may refer to a layer, which may be indefinable based on continuous material interfaces, such as lateral interfaces, having an effective refractive index $n^{\it{eff}}$ which gradually changes from an ambient refractive index $n^i$ towards a bulk refractive index $n^B$ to reduce reflection of light incident on a radiation sensor element from a front side thereof. For example, where the radiation sensor element is designed to be used under exposure to ambient air with a refractive index of about 1, the effective refractive index may gradually change from said about 1 to the bulk refractive index $n^B$.

Herein, an "effective refractive index" is an auxiliary definition related to interaction of light with a nanostructured layer. Sub-wavelength features or features substantially in a range of relevant wavelengths may make light behave in such a nanostructured layer differently from a corresponding layer of the same material(s) in the absence of such features. This different behavior may be described using the auxiliary term "effective refractive index"; light behaves in, and interacts with, such a nanostructured layer as if the layer would be made of a gradually changing bulk material having, at each level of the conversion layer, a refractive index equal to the effective refractive index $n^{\it{eff}}$ at that level.

The high aspect ratio nanostructures 135 of the embodiment of FIGS. 1 and 2 are arranged irregularly. Such irregular arrangement of high aspect ratio nanostructures may reduce a reflectance of a textured region. In other embodiments, high aspect ratio nanostructures may be arranged in any suitable arrangement(s), for example, irregularly or regularly.

In FIG. 2, two effective refractive indices $n_1^{\it{eff}}$, $n_2^{\it{eff}}$ are depicted for the two optical conversion layers 136. This indicates that $n_1^{\it{eff}}$, $n_2^{\it{eff}}$ may be independent of one another. As such, $n_1^{\it{eff}}$, $n_2^{\it{eff}}$ may have identical, similar, or different values with one another at any given level of the optical conversion layers 136. In other embodiments, any two effective refractive indices of any two optical conversion layers may or may not be independent of one another.

The high aspect ratio nanostructures 135 of the embodiment of FIGS. 1 and 2 are continuous and monolithic with the semiconductor substrate 101. Furthermore, the high aspect ratio nanostructures 135 are formed of a common material with the semiconductor substrate 101. In case of the embodiment of FIGS. 1 and 2, such common material may be Si. Generally, high aspect ratio nanostructures formed of common material with and/or continuous with and/or monolithic with a semiconductor substrate may generally exhibit lowered recombination losses. In other embodiments, high aspect ratio nanostructures may or may not be formed of common material with and/or be continuous with and/or be monolithic with a semiconductor substrate. In said other embodiments, such common material may be any suitable material, for example, Si or Ge.

The high aspect ratio nanostructures 135 of the embodiment of FIGS. 1 and 2 may be black silicon (b-Si) spikes. In other embodiments, high aspect ratio nanostructures may be b-Si spikes or any other nanostructures suitable for forming an optical conversion layer having an effective refractive index gradually changing towards a bulk refractive index.

Herein, "black silicon" may refer to a class of nanoscale surface formations on Si, producing an optical conversion layer having a gradually changing effective refractive index. A b-Si surface may comprise a plurality of needle- and/or spike-like surface formations. Individual surface formations of such a plurality of surface formations may be of varying sizes and/or arranged irregularly.

The high aspect ratio nanostructures 135 of the embodiment of FIGS. 1 and 2 may have an average height in the thickness direction in a range from 500 nm to 1500 nm. In other embodiments, high aspect ratio nanostructures may have any suitable average height in a thickness direction, for example, an average thickness in a range from 500 nm to 1500 nm, or from about 600 nm to 1200 nm, or from 800 nm to 1000 nm.

The high aspect ratio nanostructures 135 of the embodiment of FIGS. 1 and 2, may have an average width in a lateral direction parallel to the base plane 104 in a range from 50 nm to 500 nm. In other embodiments, high aspect ratio nanostructures may have any suitable average width in a thickness direction, for example, an average width in a range from 50 nm to 500 nm, or from 100 nm to 400 nm, or from 200 nm to 300 nm.

As depicted schematically in FIG. 2 for the two exemplary pixel portions 111, 112, the radiation sensor element 100 of the embodiment of FIGS. 1 and 2 comprises dielectric material 150 conformally coating the high aspect ratio nanostructures 135. Such dielectric material may generally reduce recombination losses of a radiation sensor element. In other embodiments, a radiation sensor element may or may not comprise such dielectric material.

Herein, material "conformally coating" high aspect ratio nanostructures may refer said material being formed in a shape, which follows said high aspect ratio nanostructures with a substantially uniform coating thickness. Herein, a "substantially uniform coating thickness" may refer to a relative standard deviation in coating thickness of less than 50%, or less than 25%, or less than 15%, and/or to a standard deviation in thickness of less than 20 nm, or less than 10 nm, or less than 5 nm. Generally, a coating thickness of material conformally coating high aspect ratio nanostructures may be measureable along surface normals of said high aspect ratio nanostructures. Such coating thickness may be, for example, in a range from about 1 nm to 100 nm, or from about 2 nm to 50 nm, or from about 3 nm to 30 nm, or from about 5 nm to about 20 nm.

The dielectric material 150 of the embodiment of FIGS. 1 and 2 forms a layer, extending continuously from the first pixel portion 111 depicted in FIG. 2 to the second pixel portion 112 depicted in FIG. 2. In other embodiments, dielectric material may be formed as one or more pieces, such as layers.

The dielectric material 150 of the embodiment may have a net charge of the second polarity. In case of the embodiment of FIGS. 1 and 2, the second polarity is positive. Such net charge of a second polarity may generally repel free charge carriers of the second polarity towards a collection region on a back surface of a semiconductor substrate. This may reduce recombination losses of a radiation sensor element. In other embodiments, wherein a radiation sensor element comprises dielectric material on high aspect ratio nanostructures, said dielectric material may or may not have a net charge, which may or may not be of a second polarity. In other embodiments, wherein a radiation sensor element comprises, on high aspect ratio nanostructures, dielectric material with a net charge of a second polarity, each pixel portion of a plurality of pixel portions may or may not comprise a frontal substrate layer, extending along a front surface of a semiconductor substrate and having majority charge carriers of a first polarity. Generally, a frontal substrate layer having majority charge carriers of a first polarity may exhibit reduced Auger recombination, which may increase a sensitivity of a radiation sensor element, especially at shorter wavelengths.

The dielectric material 150 of the embodiment of FIGS. 1 and 2 may comprise, for example, positively charged silicon oxide(s), such as non-stoichiometric silicon oxide ($SiO_x$). In other embodiments, any suitable dielectric material(s), such as SiOx or negatively charged aluminum oxide(s), e.g., non-stoichiometric aluminum oxide (AlOx), may be used.

In the embodiment of FIGS. 1 and 2, the radiation sensor element 100 may comprise a scintillator 170. Such scintillator 170 may be arranged, for example, on the front side of the semiconductor substrate 101, as depicted in FIG. 1 using dashed lines. Generally, a scintillator may enable converting ionizing radiation to nonionizing electromagnetic radiation detectable using a radiation sensor element with a semiconductor substrate, which exhibits weaker interactions with high-energy radiation. In other embodiments, a radiation sensor element may or may not comprise such scintillator. In embodiments, wherein a radiation sensor element comprises a scintillator on a front side of a semiconductor substrate, said scintillator may or may not be coupled to said semiconductor substrate directly or indirectly.

In the embodiment of FIGS. 1 and 2, the radiation sensor element 100 comprises multiple intermediate portions 140 between individual pixel portions of the plurality of pixel portions 110. In FIG. 1, one such intermediate portion 140 is highlighted using dashed lines. In FIG. 2, a different intermediate portion 140, arranged between the two exemplary pixel portions 111, 112 is depicted. In other embodiments, a radiation sensor element may or may not comprise at least one intermediate portion, arranged between individual pixel portions of a plurality of pixel portions. In an embodiment, individual pixel portions of a plurality of pixel portions abut one another such that textured regions of said individual pixel portions form a continuous region on a front surface of a semiconductor substrate.

Throughout this disclosure, an "intermediate portion" may refer to a part of a radiation sensor element, which may be arranged between a first pixel portion and a second pixel portion of a plurality of pixel portions. An intermediate portion may or may not extend from a front surface of a semiconductor substrate to a back surface of said semiconductor substrate.

Although the intermediate portion 140 highlighted in FIG. 1 is arranged between pixel portions of a single row or column of pixel portions, an intermediate portion may generally exist between any two pixel portions of a plurality of pixel portions, such as two pixel portions of a single row or column of pixel portions and/or two pixel portions arranged diagonally with respect to one another.

In the following, the two exemplary pixel portions 111, 112 are discussed in detail. Although the following discussion is primarily related to the two exemplary pixel portions 111, 112 and the intermediate portion 140 between them, any features disclosed in the following may or may not be applicable to any two pixel portions of the plurality of pixel portions 110 of the embodiment of FIGS. 1 and 2 and/or an intermediate portion 140 between said two pixel portions.

The intermediate portion 140 depicted in FIG. 2 comprises an intermediate region 141 on the front surface 102 of the semiconductor substrate 101. In other embodiments, an intermediate portion between any two pixel portions of a plurality of pixel portions may or may not comprise such intermediate region. In an embodiment, wherein a radiation sensor element comprises a scintillator arranged on a front side of said radiation sensor element, said scintillator is coupled to an intermediate region of an intermediate portion. In said embodiment, said coupling may be direct or indirect. As such, said coupling may be effected by any suitable means, for example, at least partly by a gluing process, which may or may not comprise an underfilling step.

Herein, an "intermediate region" may refer to a region on a front surface of a semiconductor substrate. Additionally or alternatively, an intermediate region may be arranged laterally between two pixel portions of a plurality of pixel portions.

The intermediate region 141 depicted in FIG. 2 has a root mean square (RMS) roughness lower than RMS roughnesses of the textured regions 130 of the two exemplary pixel portions 111, 112. Such lower RMS roughness may result in a higher reflectance for light incident on an intermediate portion from a front side of a radiation sensor element over a wide spectral range.

This may reduce generation of free charge carriers in an intermediate portion and/or a vicinity thereof. Such reduction in generation of free charge carriers may reduce cross talk between individual pixels of a radiation sensor element, especially in the absence of a scintillator. In other embodiments, a radiation sensor element may or may not comprise at least one intermediate portion between any two pixel portions of a plurality of pixel portions, the intermediate portion comprising an intermediate region on a front surface with a RMS roughness lower than a RMS roughness of a textured region of either of the two pixel portions.

In this disclosure, "roughness" may refer to surface roughness with higher spatial frequencies. Specifically, "root mean square roughness" may refer to a quadratic mean roughness, which may be measured for a surface and/or a cross-sectional profile thereof. Such measurement may be conducted according to at least one of standards ISO 4287: 1997 and ISO 25178. In such measurements, any suitable method(s), such as atomic force microscopy (AFM), scanning electron microscopy (SEM), scanning tunneling microscopy (STM), and/or profilometry, may be used. In case of a textured region, such measurements may be conducted for a macroscopic part of said textured region.

In this specification, "macroscopic part" may refer to at least part of a region, which is sufficiently large to be visible to the naked eye. Additionally or alternatively, a macroscopic part of a textured region may encompass or extend over at least 100, or at least 400, or at least 900 texture units, such as high aspect ratio nanostructures.

The RMS roughness of the intermediate region 141 depicted in FIG. 2 may be less than or equal to 0.2 times a RMS toughness of a textured region of either of the two pixel portions 111, 112. As such, the RMS roughness of the intermediate region 141 may be higher than or equal to five times a RMS roughness of the textured region 130 of the first pixel portion 111 and higher than or equal to five times a RMS roughness of the textured region 130 of the second pixel portion 112. Generally, a higher RMS roughness difference may result in lower cross talk between individual pixels of a radiation sensor element. In other embodiments, any suitable ratio may be used between RMS roughnesses of two textured regions and a RMS roughness of an intermediate region arranged between said two textured regions. For example, a RMS roughness of an intermediate region between two pixel portions may be less than or equal to 0.2, or 0.1, or 0.05, or 0.01 times a RMS roughness of a textured region of either of said two pixel portions.

The intermediate region 141 depicted in FIG. 2 extends substantially parallel to the base plane 104. An intermediate region extending substantially parallel to a base plane may generally facilitate coupling a scintillator to a semiconductor substrate. In other embodiments, an intermediate region may or may not extend substantially parallel to a base plane.

The textured regions 130 of the two pixel portions 111, 112 depicted in FIG. 2 have a maximum distance $d_{tr}^{max}$ to the base plane 104. Additionally, the intermediate region 141 depicted in FIG. 2 has a minimum distance $d_{ir}^{min}$ to the base plane 104 greater than $d_{tr}^{max}$. Such $d_{ir}^{min}$ may generally further facilitate coupling a scintillator to a semiconductor substrate. This may be due to reduced risk of high aspect ratio nanostructures breaking during said coupling, since direct contact between the high aspect ratio nanostructures and the scintillator may be avoided. In other embodiments, a $d_{ir}^{min}$ may or may not be greater than $d_{tr}^{max}$ for any intermediate portion between any two pixel portions of a plurality of pixel portions.

With reference to FIG. 2, the radiation sensor element 100 comprises a metal coating 160. The metal coating 160 is arranged on the front side of the semiconductor substrate 101 such that a projection of the metal coating 160 on the base plane 104 intersects a projection of the intermediate region 141 on the base plane 104. Such metal coating may increase a reflectivity of a radiation sensor element for light incident towards an intermediate portion thereof over a wide spectral range, which may reduce generation of free charge carriers in an intermediate portion and/or a vicinity thereof. Such reduction in generation of free charge carriers may reduce cross talk between individual pixels of a radiation sensor element, especially in the absence of a scintillator. In other embodiments, a radiation sensor element may or may not comprise such metal coating.

Herein, a "coating" may refer to an element, such as a layer, extending over a surface or part thereof. Specifically, a coating "on a front side" of a region may or may not be directly or indirectly coupled to said region. Further, a "metal coating" may refer to a coating, which comprises or is formed of metallic material.

It is to be understood that any of the preceding embodiments of the first aspect may be used in combination with each other. In other words, several of the embodiments may be combined together to form a further embodiment of the first aspect.

Above, mainly structural and material aspects of radiation sensor elements are discussed. In the following, more emphasis will lie on aspects related to methods for fabricating a radiation sensor element comprising a plurality of pixel portions. What is said above about the ways of implementation, definitions, details, and advantages related to the structural and material aspects apply, mutatis mutandis, to the method aspects discussed below. The same applies vice versa.

It is specifically to be understood that a method according to the second aspect may be used to provide a radiation sensor element according to the first aspect and any of the embodiments described in relation to the first aspect. Correspondingly, any radiation sensor element according to any embodiment of the first aspect may be fabricated using a method according to the second aspect.

Figure 3:
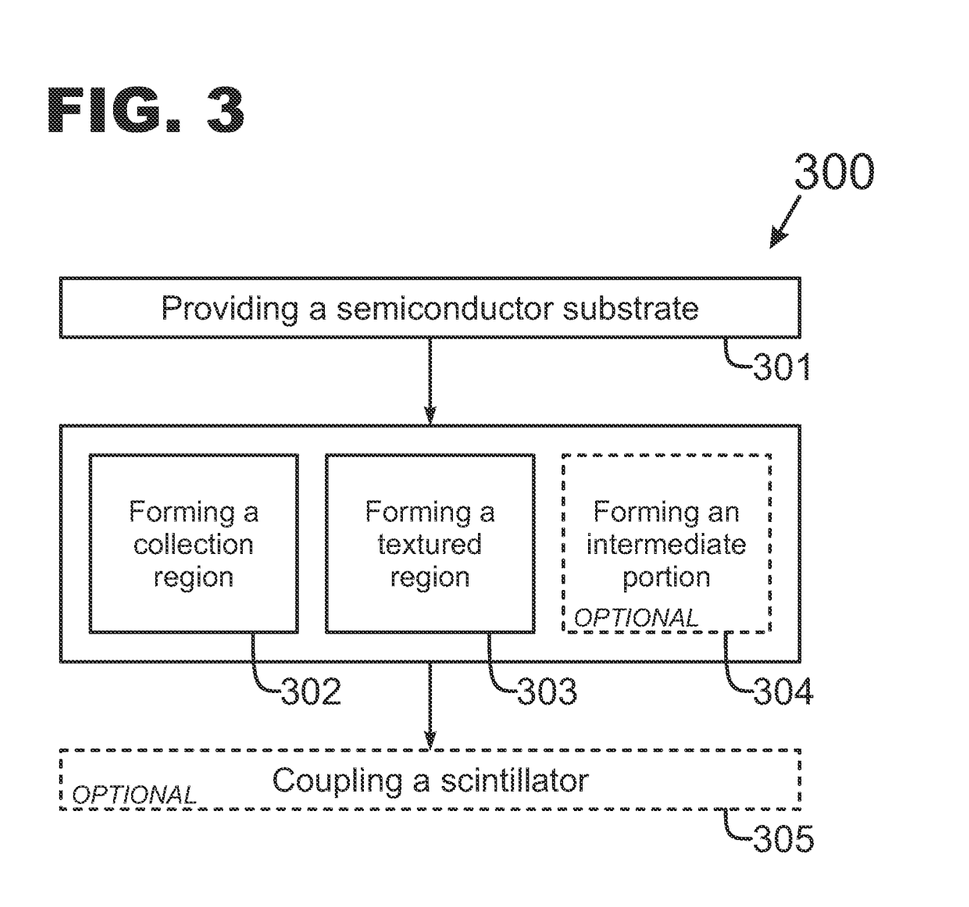
FIG. 3 illustrates a method for fabricating a radiation sensor element comprising a plurality of pixel portions.

FIG. 3 illustrates a method 300 for fabricating a radiation sensor element comprising a plurality of pixel portions. In other embodiments, such method may comprise processes and/or steps similar or substantially different to the processes and/or steps, respectively, of the embodiment of FIG. 3.

In this specification, a "process" may refer to a series of one or more steps, leading to an end result. Additionally, a "step" may refer to a measure taken in order to achieve one or more pre-defined end results. Generally, a process may be a single-step or a multistep process. Additionally, a process may be divisible to a plurality of sub-processes, wherein individual sub-processes of such plurality of sub-processes may or may not share common steps.

In the embodiment of FIG. 3, the method 300 comprises, in process 301, providing a semiconductor substrate. The semiconductor substrate has bulk majority charge carriers of a first polarity, which may be either negative or positive. The semiconductor substrate also has a bulk refractive index and a front surface, which defines a front side of the semiconductor substrate. The semiconductor substrate further has a back surface, arranged opposite the front surface and extending substantially along a base plane.

The method 300 of the embodiment of FIG. 3 comprises, in process 302, forming a collection region on the back surface for each pixel portion of the plurality of pixel portions. The collection regions are suitable for collecting free charge carriers of a second polarity opposite in sign to the first polarity. In some embodiments, a process of forming a collection region may comprise, for example, an ion implantation step. In the embodiment of FIG. 3, the method 300 comprises, in process 303, forming a textured region on the front surface for each pixel portion of the plurality of pixel portions. Each textured region comprises high aspect ratio nanostructures, extending substantially along a thickness direction perpendicular to the base plane and forming an optical conversion layer, having an effective refractive index gradually changing towards the bulk refractive index of the semiconductor substrate. This reduces reflection of light incident on said pixel portion from the front side of the semiconductor substrate.

In the embodiment of FIG. 3, the process 303 of forming a textured region may comprise, for example, a metal-assisted chemical etching (MACE) step, an atmospheric dry etching (ADE) step, and/or a reactive ion etching (RIE) step, such as a deep reactive ion etching (DRIE) step. Generally, such etching steps may facilitate forming textured regions in a manner resulting in a low defect density and well-defined nanoscale features. In other embodiments, a process of forming a textured region may comprise any suitable step(s), for example, a MACE step, an ADE step, and/or a RIE step, such as a DRIE step.

In the embodiment of FIG. 3, the method 300 comprises, in optional process 304, forming an intermediate portion between two pixel portions of the plurality of pixel portions. The intermediate portion comprises an intermediate region on the front surface of the semiconductor substrate with a RMS roughness lower than a RMS roughness of a textured region of either of the two pixel portions. In other embodiments, a method for fabricating a radiation sensor element comprising a plurality of pixel portions may or may not comprise such process of forming an intermediate portion.

As indicated by the ordering of boxes representing processes 302, 303, and 304, steps implementing said processes 302, 303, 304 may generally be completed in various alternative orders. Further, a step may generally contribute to more than one of said processes 302, 303, 304. For instance, an etching step, e.g., a MACE step, an ADE step, and/or a RIE step, such as a DRIE step, may contribute both to a process of forming a textured region and to a process of forming an intermediate portion. Such may occur, for example, if a semiconductor substrate having a polished front surface is provided and etching in said etching step is done locally, for example, using an etching mask.

In the embodiment of FIG. 3, the method 300 comprises, in optional process 305, coupling a scintillator onto the intermediate region. Such process may generally comprise, for example, an adhesive bonding step. In other embodiments, a method for fabricating a radiation sensor element comprising a plurality of pixel portions may or may not comprise such process of coupling a scintillator.

In an embodiment, a method for fabricating a radiation sensor element comprising a plurality of pixel portions comprises processes corresponding to the processes 301, 302, and 303 of the method 300 of the embodiment of FIG. 3. In other embodiments, a method for fabricating a radiation sensor element comprising a plurality of pixel portions may comprise processes corresponding to the processes 301, 302, and 303 as well as at least one of the processes 304 and 305 of the method 300 of the embodiment of FIG. 3.

Generally, steps of a method for fabricating a radiation sensor element comprising a plurality of pixel portions implementing processes corresponding to any of the processes 301, 302, 303, 304, 305 of the method 300 of the embodiment of FIG. 3 may be executed in multiple alternative orders. Additionally, a method for fabricating a radiation sensor element comprising a plurality of pixel portions may generally comprise any number of additional processes or steps that are not disclosed herein in connection to the method 300 of the embodiment of FIG. 3.

For example, in an embodiment, a method for fabricating a radiation sensor element, comprising a plurality of pixel portions, comprises depositing dielectric material onto high aspect ratio nanostructures, the dielectric material conformally coating the high aspect ratio nanostructures.

In another embodiment, which may be in accordance with the preceding embodiment, a method for fabricating a radiation sensor element, comprising a plurality of pixel portions, comprises forming a metal coating on a front side of an intermediate region. In said embodiment, the process of forming a metal coating may comprise, for example, an evaporation step or a sputtering step.

It is obvious to a person skilled in the art that with the advancement of technology, the basic idea of the invention may be implemented in various ways. The invention and its embodiments are thus not limited to the examples described above, instead they may vary within the scope of the claims.

It will be understood that any benefits and advantages described above may relate to one embodiment or may relate to several embodiments. The embodiments are not limited to those that solve any or all of the stated problems or those that have any or all of the stated benefits and advantages.

The term "comprising" is used in this specification to mean including the feature(s) or act(s) followed thereafter, without excluding the presence of one or more additional features or acts. It will further be understood that reference to 'an' item refers to one or more of those items.

REFERENCE SIGNS 100 radiation sensor element
101 semiconductor substrate
102 front surface
103 back surface
104 base plane
110 plurality of pixel portions
111 pixel portion
112 pixel portion
120 collection region
121 collection doping well
122 bulk contact region
123 bulk contact doping well
130 textured region
135 high aspect ratio nanostructures
136 optical conversion layer
140 intermediate portion
141 intermediate region
150 dielectric material
160 metal coating
170 scintillator
300 method
301 providing a semiconductor substrate
302 forming a collection region
303 forming a textured region
304 forming an intermediate portion
305 coupling a scintillator

The invention claimed is:

1. A radiation sensor element comprising a semiconductor substrate, having bulk majority charge carriers of a first polarity, a bulk refractive index, a front surface, defining a front side of the semiconductor substrate, and a back surface, arranged opposite the front surface and extending substantially along a base plane;

the radiation sensor element comprising a plurality of pixel portions, each pixel portion of the plurality of pixel portions comprising a collection region on the back surface for collecting free charge carriers of a second polarity opposite in sign to the first polarity;

wherein each pixel portion of the plurality of pixel portions comprises a textured region on the front surface, the textured region comprising high aspect ratio nanostructures, extending substantially along a thickness direction perpendicular to the base plane and forming an optical conversion layer, having an effective refractive index gradually changing towards the bulk refractive index to reduce reflection of light emitted by a scintillator and incident on said pixel portion from the front side of the semiconductor substrate;

the radiation sensor element comprises an intermediate portion between two pixel portions of the plurality of pixel portions, the intermediate portion comprising an intermediate region on the front surface with a root mean square, RMS, roughness lower than a RMS roughness of a textured region of either of the two pixel portions; and the radiation sensor element comprises the scintillator coupled to the intermediate region.

2. A radiation sensor element according to claim 1, wherein the RMS roughness of the intermediate region is less than or equal to 0.2 times a RMS roughness of a textured region of either of the two pixel portions.

3. A radiation sensor element according to claim 1, wherein the intermediate region extends substantially parallel to the base plane.

4. A radiation sensor element according to claim 1, wherein textured regions of the two pixel portions have a maximum distance $d_{tr}^{max}$ to the base plane and the intermediate region has a minimum distance $d_{ir}^{min}$ to the base plane greater than $d_{tr}^{max}$.

5. A radiation sensor element according to claim 1, comprising a metal coating on the front side of the semiconductor substrate, a projection of the metal coating on the base plane intersecting a projection of the intermediate region on the base plane.

6. A radiation sensor element according to claim 1, wherein the semiconductor substrate and the high aspect ratio nanostructures are formed of silicon, Si.

7. A radiation sensor element according to claim 1, wherein the radiation sensor element comprises dielectric material conformally coating the high aspect ratio nanostructures.

8. A radiation sensor element according to claim 7, wherein the dielectric material has a net charge of the second polarity.

9. A radiation sensor element according to claim 1, wherein the collection region is defined by a collection doping well with majority charge carriers of the second polarity.

10. A radiation sensor element according to claim 1, comprising the scintillator arranged on the front side of the semiconductor substrate.

11. A radiation sensor element according to claim 1, wherein the RMS roughness of the intermediate region is less than or equal to 0.1 times a RMS roughness of a textured region of either of the two pixel portions.

12. A radiation sensor element according to claim 1, wherein the RMS roughness of the intermediate region is less than or equal to 0.05 times a RMS roughness of a textured region of either of the two pixel portions.

13. A radiation sensor element according to claim 1, wherein the RMS roughness of the intermediate region is less than or equal to 0.01 times a RMS roughness of a textured region of either of the two pixel portions.

14. A method for fabricating a radiation sensor element comprising a plurality of pixel portions, the method comprising:

providing a semiconductor substrate, having bulk majority charge carriers of a first polarity, a bulk refractive index, a front surface, defining a front side of the semiconductor substrate, and a back surface, arranged opposite the front surface and extending substantially along a base plane;

for each pixel portion of the plurality of pixel portions, forming a collection region on the back surface for collecting free charge carriers of a second polarity opposite in sign to the first polarity;

for each pixel portion of the plurality of pixel portions, forming a textured region (303) on the front surface, the textured region comprising high aspect ratio nanostructures, extending substantially along a thickness direction perpendicular to the base plane and forming an optical conversion layer, having an effective refractive index gradually changing towards the bulk refractive index to reduce reflection of light emitted by a scintillator and incident on said pixel portion from the front side of the semiconductor substrate;

forming an intermediate portion between two pixel portions of the plurality of pixel portions, the intermediate portion comprising an intermediate region on the front surface with a root mean square, RMS, roughness lower than a RMS roughness of a textured region of either of the two pixel portions; and coupling the scintillator onto the intermediate region.

15. A method according to claim 14, wherein the process of forming a textured region comprises a metal-assisted chemical etching, MACE, step, an atmospheric dry etching, ADE, step, and/or a reactive ion etching, RIE, step.

16. A method according to claim 14,
wherein the RMS roughness of the intermediate region is less than or equal to 0.2 times a RMS roughness of a textured region of either of the two pixel portions.

17. A method according to claim 14, wherein the process of forming a textured region comprises a metal-assisted chemical etching, MACE, step, an atmospheric dry etching, ADE, step, and/or a deep reactive ion etching, DRIE, step.

18. A method according to claim 14, wherein the RMS roughness of the intermediate region is less than or equal to 0.1 times a RMS roughness of a textured region of either of the two pixel portions.

19. A method according to claim 14, wherein the RMS roughness of the intermediate region is less than or equal to 0.05 times a RMS roughness of a textured region of either of the two pixel portions.

20. A method according to claim 14, wherein the RMS roughness of the intermediate region is less than or equal to 0.01 times a RMS roughness of a textured region of either of the two pixel portions.

* * * * *